United States Patent
Ling et al.

(10) Patent No.: US 9,248,536 B2
(45) Date of Patent: Feb. 2, 2016

(54) TURNTABLE

(71) Applicant: Texas Instruments Incorporated, Dallas, TX (US)

(72) Inventors: Wong Tzu Ling, Kuala Lumpur (MY); Teh Hong Ping, Kedah (MY); Prabakaran Sundram, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 60 days.

(21) Appl. No.: 14/178,852

(22) Filed: Feb. 12, 2014

(65) Prior Publication Data

US 2015/0224615 A1    Aug. 13, 2015

(51) Int. Cl.
*A47B 57/00*    (2006.01)
*B23Q 1/64*    (2006.01)

(52) U.S. Cl.
CPC ........................................ *B23Q 1/64* (2013.01)

(58) Field of Classification Search
CPC ............. A47F 3/085; A47F 3/10; A47F 3/11; A47F 5/02; A47F 5/025; A47F 5/03
USPC ................... 108/94, 22, 20; 74/16; 248/349.1
See application file for complete search history.

(56) References Cited

U.S. PATENT DOCUMENTS

| | | | | |
|---|---|---|---|---|
| 723,269 | A * | 3/1903 | Hammock | 108/94 |
| 877,812 | A * | 1/1908 | Vogler | 108/94 |
| 1,754,094 | A * | 4/1930 | Glass, Sr. | 108/94 |
| 3,636,299 | A * | 1/1972 | Stewart, Jr. | 108/94 |
| 5,685,232 | A * | 11/1997 | Inoue | 108/20 |
| 5,706,843 | A * | 1/1998 | Matsuo | 108/22 |
| 5,878,671 | A * | 3/1999 | Kehl | 108/22 |
| 6,868,794 | B2 * | 3/2005 | Bullock et al. | 108/94 |
| 8,439,338 | B2 * | 5/2013 | Taniguchi et al. | 108/22 |

* cited by examiner

*Primary Examiner* — Jose V Chen
(74) *Attorney, Agent, or Firm* — Steven A. Shaw; Frank D. Cimino

(57) ABSTRACT

An apparatus for rotating a load about a predetermined rotation axis of the apparatus. The apparatus includes a rotatable shaft having a central longitudinal axis; a turntable fixedly mounted on the rotatable shaft; an annular centering surface; and a stud member positioned opposite the annular centering surface. Either the annular centering surface or the stud member is affixed to the turntable. The annular centering surface and the stud member are adapted to co-act to maintain the central longitudinal axis of the rotatable shaft in alignment with the predetermined rotation axis of the apparatus.

12 Claims, 9 Drawing Sheets

TURNTABLE

BACKGROUND

Early turntables were used to make pottery by rotating and hand forming loads of malleable clay deposited on top surfaces thereof. Presently, turntables are used in the high tech industry for many different purposes such as flux cleaning after solder ball attachment, wafer spin rinse drying, and wafer wetting processing, to name a few.

An unbalanced load placed on the top surface of a turntable may lead to a displacement of the rotation axis of the turntable from an ideal rotation axis. Such displacement can cause stress on the rotatable shaft on which the turntable is mounted and to bearings, etc., supporting the shaft. Such rotation axis displacement, particularly at high rotation speeds, can produce vibration that can cause further damage to the turntable and associated equipment.

DETAILED DESCRIPTION

As used herein, spatial reference terms such as up, down, bottom, top, vertical, horizontal, lateral, left, right, etc., are used in a relative sense for establishing a frame of reference, which is used for describing the spatial relationship between objects or various parts of an object. These terms are not used in an absolute sense that implies the orientation of an object in a field of gravity. Using the term "top" in this relative sense with a table that is described as having "a top surface that supports a computer," such surface would be correctly referred to as the "top surface" of the desk even if the desk were flipped upside down or resting on its side.

Figure 2:
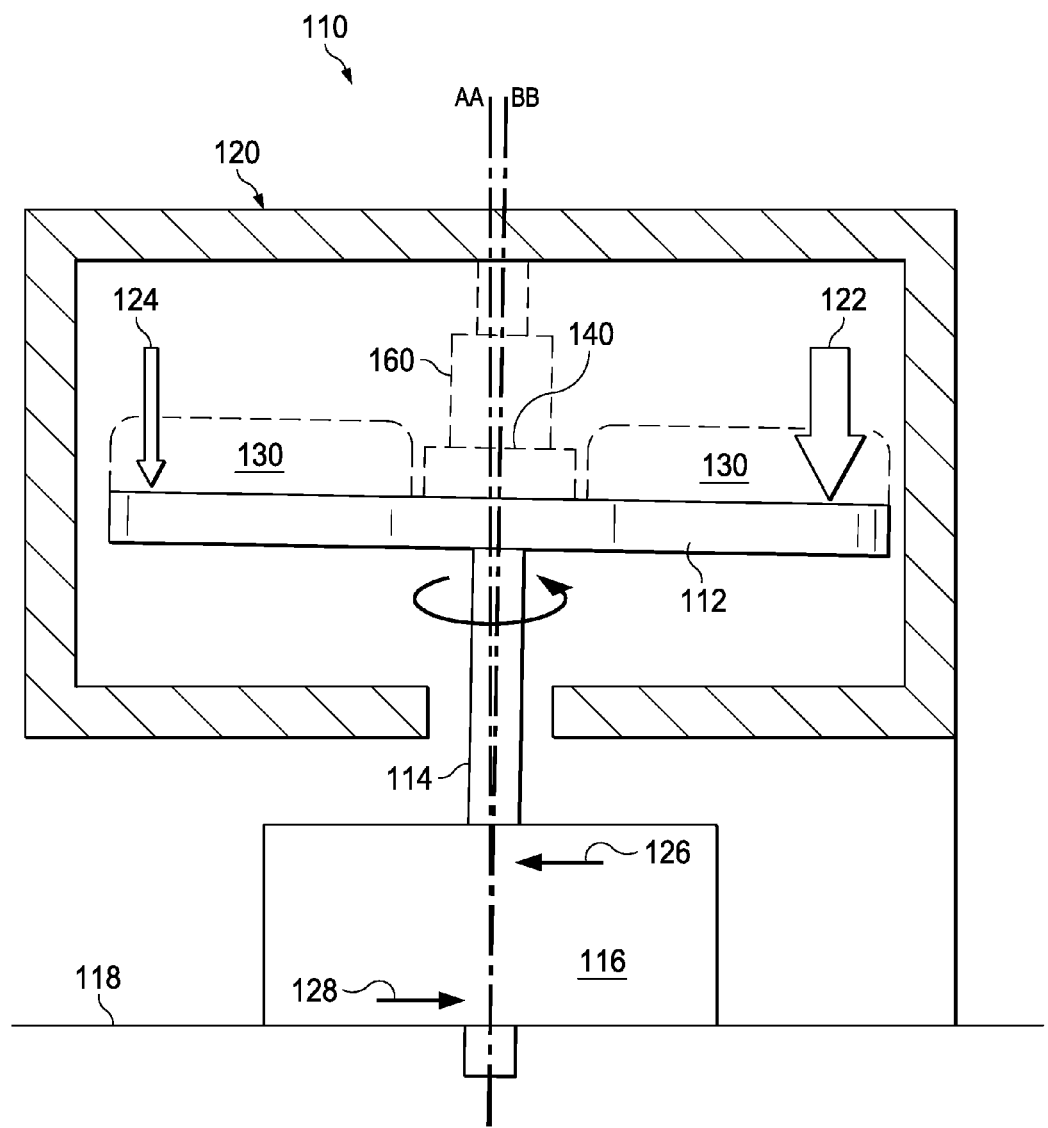
FIG. 2 is a schematic cross sectional view of an example embodiment of a self-centering turntable apparatus.

In general, this specification discloses an apparatus 110, FIG. 2, for rotating a load 130 about a predetermined rotation axis AA. The apparatus 110 includes a rotatable shaft 114 having a central longitudinal axis BB; a turntable 112 fixedly mounted on the rotatable shaft 114; an annular centering surface 140; and a stud member 160 positioned opposite the annular centering surface 140. Either the annular centering surface 140 or the stud member 160 is fixedly associated with the turntable 112. The annular centering surface 140 and the stud member 160 are adapted to co-act to maintain the central longitudinal axis BB of the rotatable shaft 114 in alignment with the predetermined rotation axis AA of the apparatus 110. Having thus described apparatus 110 generally, various features of the apparatus 110 and alternative embodiments thereof as well as an exemplary prior art apparatus 10 will now be described in detail.

Figure 1:
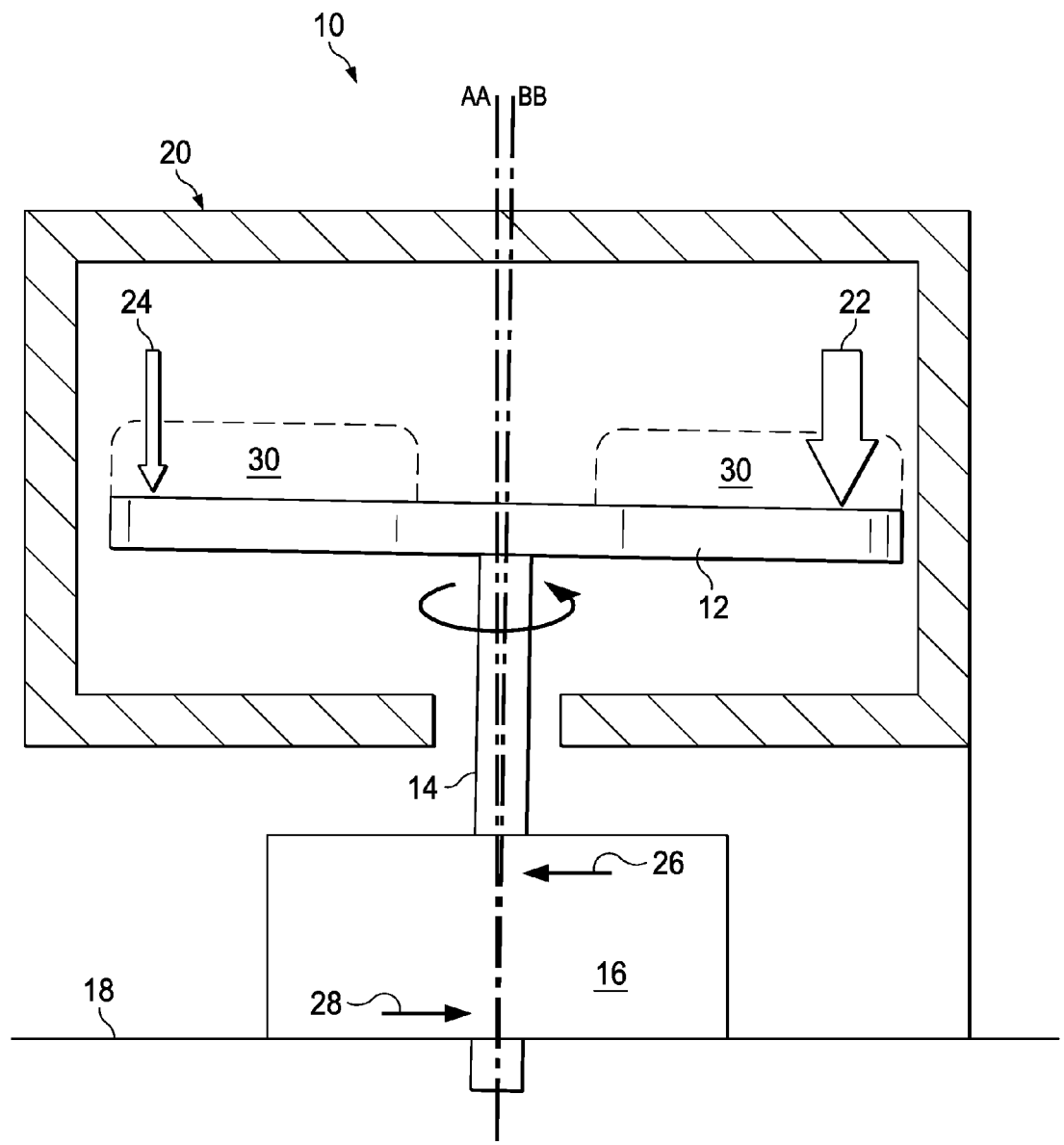
FIG. 1 is a schematic cross sectional view of a prior art turntable apparatus.

FIG. 1 is a side elevation view of a conventional turntable apparatus 10 of the prior art. The turntable apparatus 10 has a circular turntable plate 12 mounted on a rotatable shaft 14. The rotatable shaft 14 extends from an electric drive motor 16 or other rotation device that rotates the rotatable shaft 14 and attached turntable plate 12 about a shaft rotation axis BB. A load 30 is supported on the upper surface of the turntable plate 12. The motor 16 is mounted on a base 18, which is fixedly associated with an apparatus housing 20. The shaft rotation axis BB is aligned (coaxial) with a predetermined rotation axis AA, when the apparatus 10 is in a balanced state, i.e., when there is no asymmetric loading of the turntable plate 12.

As further illustrated by FIG. 1, the load 30 on the turntable plate 12 may be unbalanced such that one side of the turntable has a downward force 22 applied thereto which is less than the downward force 24 on the other side of the turntable. The result of this uneven loading is that the actual rotation axis BB may be slightly skewed with respect to the desired rotation axis AA at any given instant. The result in a dynamic situation with the turntable spinning at a high rotational velocity is that the shaft rotation axis BB may wobble and vibrate. This vibration places stress 26, 28 on the bearings of the motor 16 and may cause undesirable noise and vibration of the entire apparatus 10.

FIG. 2 illustrates a turntable apparatus 110 having a turntable plate 112 (sometimes referred to simply as "turntable"). The turntable 112 has an upper surface adapted to support a load 130. The turntable 112 is fixedly mounted on a rotatable shaft 114. The shaft 114 has an actual rotation axis BB that is aligned with a predetermined axis AA of the apparatus 110 when the apparatus 110 is in a balanced state. The rotatable shaft 114 is driven by an electric motor 116 or other rotation device, which is fixedly mounted on a base surface 118. The base surface 118 may be a part of the turntable housing 120.

The turntable 112 has a centering surface 140 fixedly associated therewith. The centering surface 140 has a central axis DD, FIGS. 3 and 4, aligned with the actual central axis of rotation BB of the rotatable shaft 114. A stud member 160 is positioned opposite the centering surface 140 and is fixedly attached to a stationary support surface, such as the turntable housing 120. The stud member 160 has a central longitudinal axis CC, FIG. 5, which is in coaxial alignment with the predetermined rotation axis AA of the turntable 112.

Figure 3:
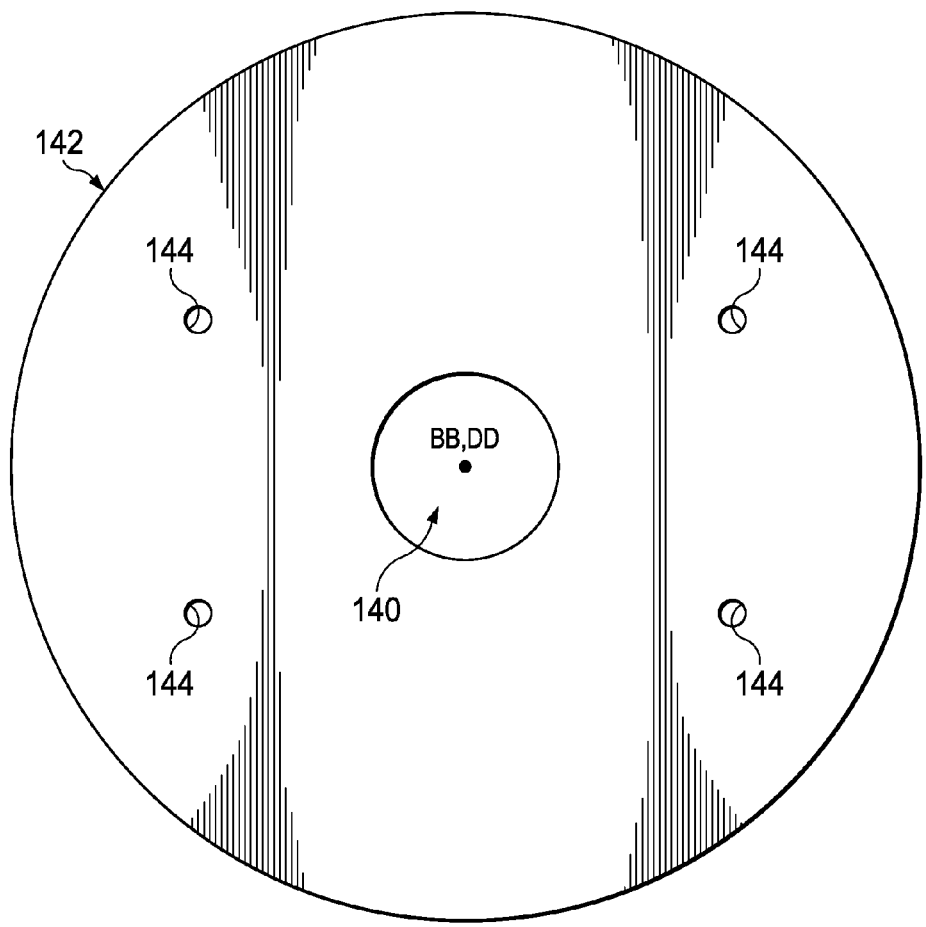
FIG. 3 is a top plan view of an example embodiment of an annular centering surface provided on a centering plate.
Figure 4:
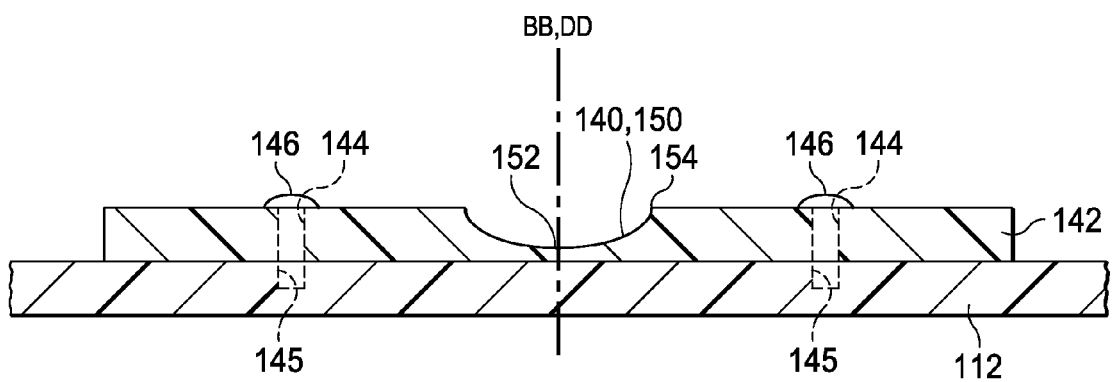
FIG. 4 is a cross sectional elevation view of the centering plate of FIG. 3 attached to a turntable.
Figure 5:
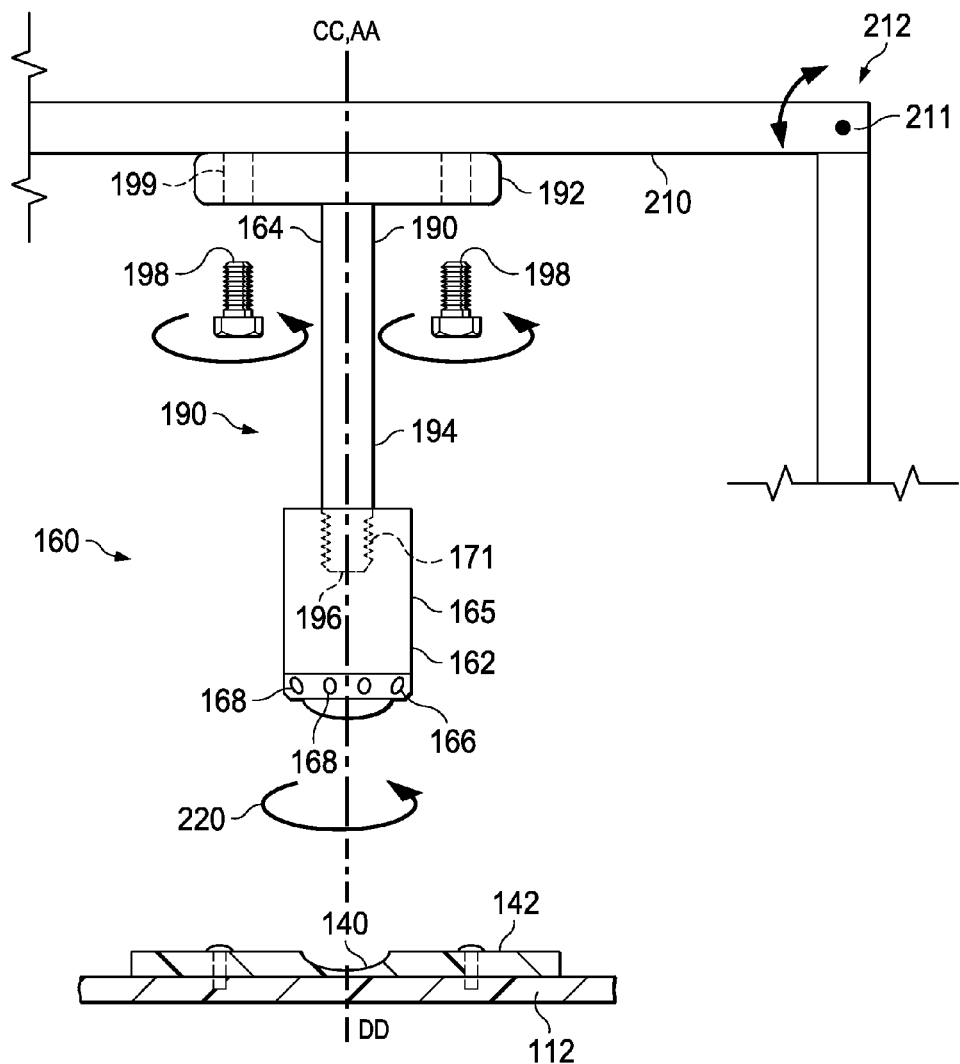
FIG. 5 is a partially cross sectional elevation view of a portion of an example embodiment of a self centering turntable apparatus.

In the embodiment shown in FIGS. 3-5, the centering surface 140 is provided on a separate centering plate 142 that is mounted on the turntable 112. Again, the central axis DD of the centering surface 140 is aligned with the actual rotation axis BB of the turntable 112. The centering plate 142 may be mounted on the turntable 112 by aligning holes 144 in the plate 142 with holes 145 in the turntable 112, and attaching the plate and turntable together with machine screws 146 or with bolts, rivets, adhesive, solder, or other means of attachment. The annular centering surface 140 shown in FIGS. 3 and 4 is an arcuate surface 150 which in one embodiment has a radius of curvature of about 1.25 inches. The annular centering surface 140 may also have other surface shapes, as described in further detail below. The distance between the bottom 152 of the arcuate surface 150 and the top edge 154 of the arcuate surface 150, in one embodiment, is about 0.50 in (1.27 cm).

Figure 9:
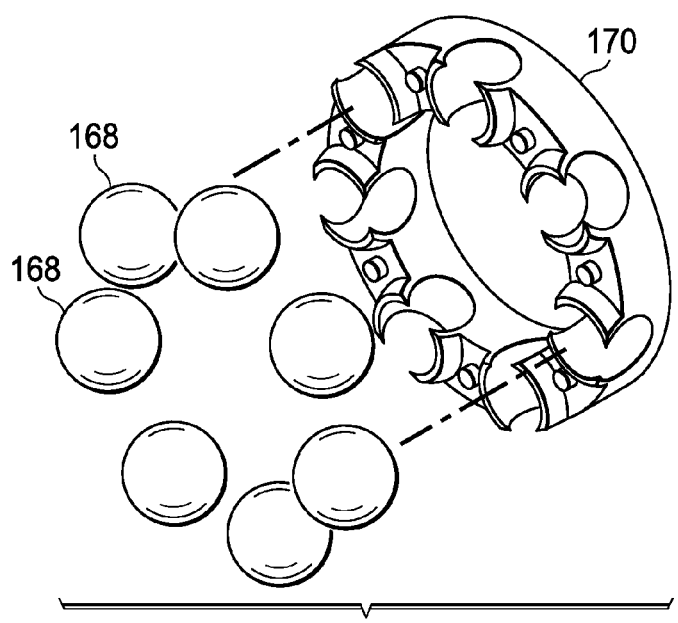
FIG. 9 is an exploded detail view of ball bearings and a retainer ring of a stud member.

With reference to FIG. 5, the stud member 160 may have a distal end portion 162, which is positioned opposite to the annular centering surface 140. The stud member 160 has a proximal end portion 164, which may be fixedly attached to a stationary surface, such as the turntable apparatus frame 210, with that the central longitudinal axis CC of the stud member 160 in coaxial alignment with the predetermined rotation axis AA of the turntable 112. As best shown in FIGS. 5-8, the proximal end portion 164 of the stud member 160 has at least one low friction contact surface 166, which is adapted to contact the centering surface 140 when the central longitudinal axis CC of the stud member 160 is out of alignment with the central longitudinal axis DD of the centering surface 140. The at least one contact surface 166 may comprise a plurality of rotatable bearings such as small ball bearings 168 located about a peripheral tip portion of the stud member 160. The ball bearings 168 may be held in position, as by a retainer ring 170, FIG. 9. The retainer ring 170, and the distal end portion 162 of the stud member 160 to which it is attached, may be constructed and arranged such that each small ball bearing 168 projects outwardly from a face surface 171 of the retainer ring 170 that is inclined at an angle "a" with respect to the central longitudinal axis CC of the stud member 160. In one embodiment, a is approximately 45° and the ball bearings 168 may be mounted in spaced apart relationship from indented surfaces 172, FIG. 8, of the stud member 160, such that the ball bearings 168 rotate freely within the retainer ring 170. The retainer ring 170 may also comprise a larger center opening in which a larger center ball 173 is mounted. The central opening may comprise a portion of an arcuate socket assembly 174 that includes a plurality of tiny ball bearings 175 positioned between the larger ball 173 and a socket wall 176. A biasing spring 177 engages the ball socket assembly 174 urging it and the center ball 173 downwardly, toward the opposing annular centering surface 140. Upward pressure on the ball 173 moves the socket assembly 174 upwardly until engaging a shoulder portion 179 of a cylindrical cavity 178 in which the spring 177 and ball socket assembly 174 are mounted. The height of this shoulder 179 from the bottom surface of the stud member 160 in one embodiment is about 0.30 inches.

Figure 10:
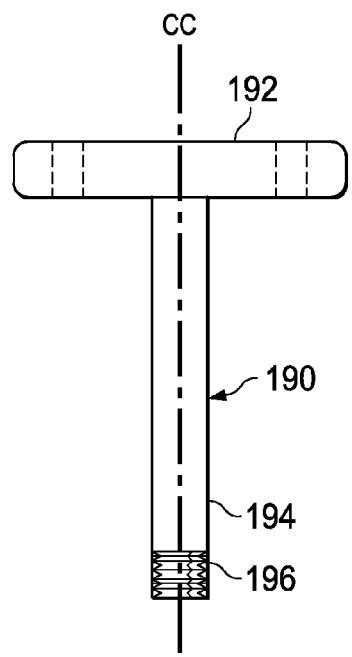
FIG. 10 is a side elevation view of an example embodiment of a mushroom shaped extension member portion of a stud member.
Figure 11:
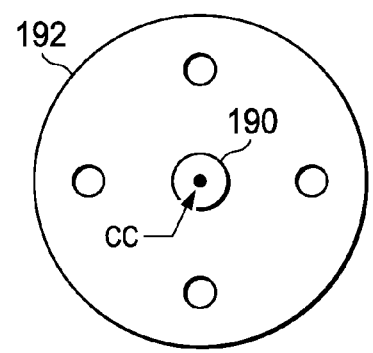
FIG. 11 is a bottom plan view of the mushroom shaped extension member of FIG. 10.

As best illustrated in FIGS. 5, 10 and 11, the stud member 160 may comprise a mushroom-shaped extension member 190 that is attached to a lower cylindrical portion 165, sometimes referred to herein as "balancer portion 165." The extension member 190 includes a circular plate portion 192 and an elongate rod portion 194 extending perpendicular to the plate portion 192. Rod portion 194 may have the same central longitudinal axis CC as that of the stud member 160. A threaded portion 196 at the end of the mushroom-shaped member 190 enables the mushroom-shaped member to be attached to the lower cylindrical 165 through corresponding threads 171 therein, FIG. 8.

As best illustrated by FIG. 5, the mushroom shaped extension portion 190 may be fixedly mounted on a plate portion 210 of the turntable apparatus frame 212. The plate portion 210 remains stationary during normal turntable operation. The extension member circular plate portion 192 may be attached as by screws 198 passing through holes 199 in the plate portion 192 and corresponding threaded bores in the stationary plate member 210 of the frame 212. Thus in operation, the stud member 160 is held in a fixed position with respect to the frame 212 and the base 118 upon which the motor 116 is mounted. The plate portion 210 may be mounted by a pivot joint 211 to another portion of the frame 212, enabling it to be rotated and locked into the position shown in FIG. 5. The stud member 160 may be moved away from the turntable 112 during periods when the turntable 112 is not rotating to facilitate placement or removal of a load 230 therefrom, FIGS. 12 and 13.

Figure 12:
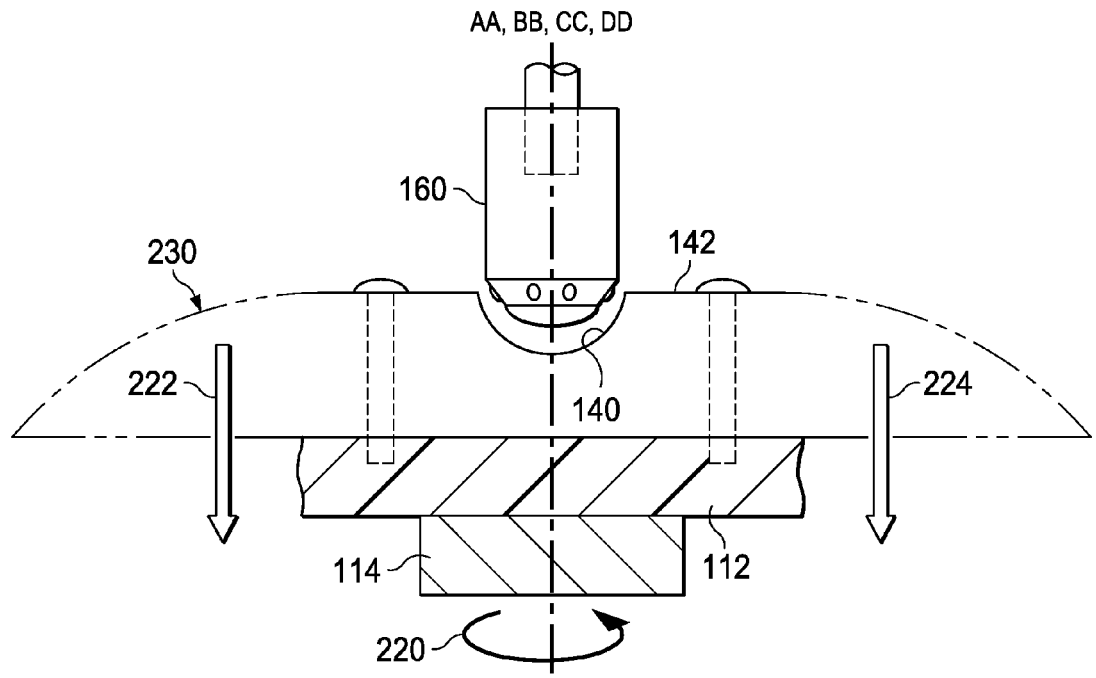
FIG. 12 is a partially cross sectional detail view showing the relationship between the distal end of a stud member and an annular centering surface of a self centering turntable apparatus in a balanced condition.

FIG. 12 illustrates the position of the stud member 160 and centering surface 140 when the loading of the turntable 112 is balanced such that the predetermined ideal axis of rotation AA of the apparatus 110, FIG. 2, and the actual rotation axis BB of the rotatable shaft 114 and turntable 112 are coaxial. It will also be appreciated, that in this condition, the central longitudinal axis CC of the stud member 160, which is coaxial with the ideal axis AA, and the central longitudinal axis DD of the annular centering surface 140, which is coaxial with the rotatable shaft and turntable actual rotation axis BB, are also in coaxial alignment. In this balanced operating condition, the forces 222, 224 applied to opposite sides of the turntable by the object 230 supported thereon may be substantially equal. Thus in this position, there is no bending or inclination of the actual rotation axis BB with the ideal rotation axis AA.

Figure 13:
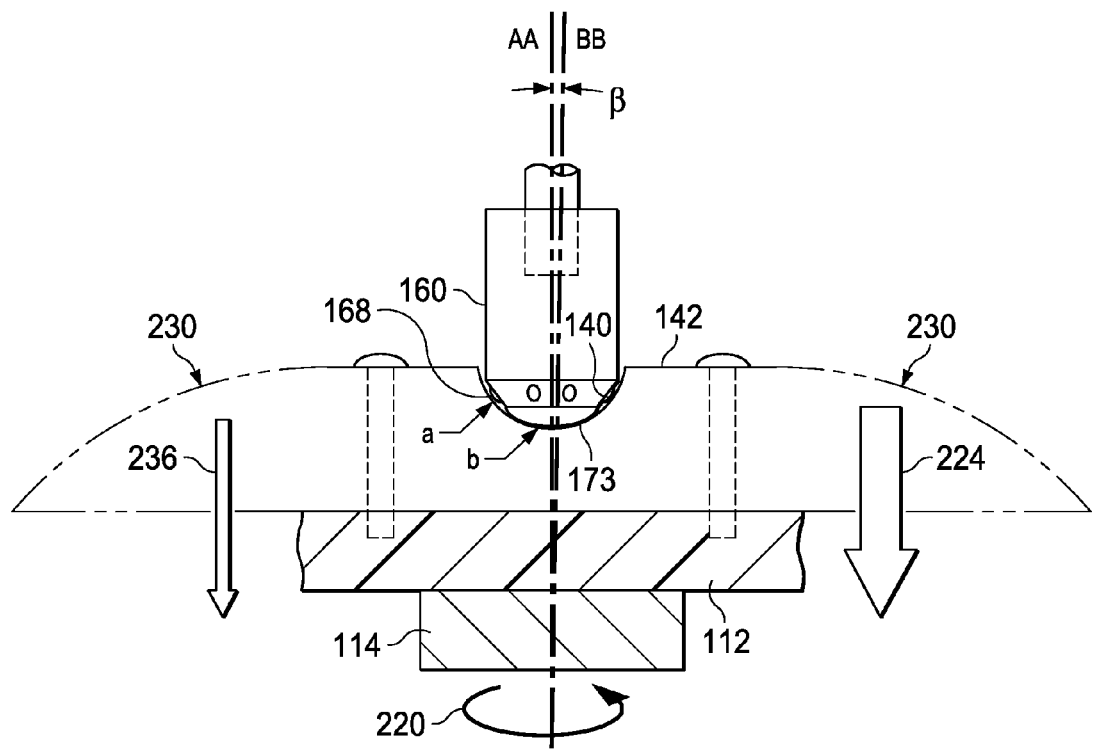
FIG. 13 is a partially cross sectional detail view showing the relationship between the distal end of a stud member and an annular centering surface of a self centering turntable apparatus in an unbalanced condition.

In the unbalanced state of the apparatus 110 illustrated in FIG. 13, the portion of the object 230 on the right side of the drawing weighs somewhat more than the portion on the left side, and thus the downward force 224 exerted by the right side is greater than the downward force 226 applied to the left side. As a result of this imbalance, the actual rotation axis BB is skewed slightly to the right of the ideal rotation axis AA at an angle "β." However, in this unbalanced operating state, one of the ball bearings 168 located on the left side of the drawing makes contact with annular surface 140 at point a. Also, as a consequence of the angular displacement β, the bottom portion of the annular surface 140 moves relatively upwardly with respect to the ball 173 making contact therewith at point b. However, the contact between the stud 160 and the annular centering surface 140 at points a and b, causes a rebound effect between the stud 160 and the annular centering surface 140 that causes the surfaces to shift towards a centered position in which the angle β between axes AA and BB is approximately 0°. Thus the disclosed structure produces an automatic self-centering or self-alignment to occur each time the axes AA and BB go out of alignment, at least within a predetermined range of operation. As a result of this self-centering feature, the turntable 112 and rotatable shaft 114 are displaced only a small amount before balance is restored and thus the associated wobble and vibration caused by an unbalanced condition is obviated.

Figure 14:
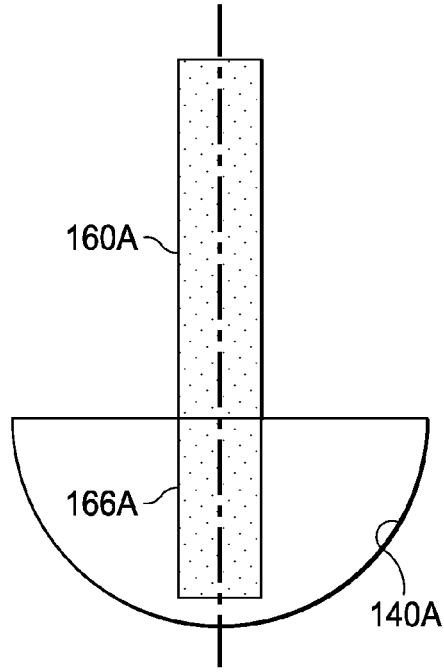
FIG. 14 is a schematic cross sectional view of one alternative configuration of a stud member and annular centering surface.
Figure 15:
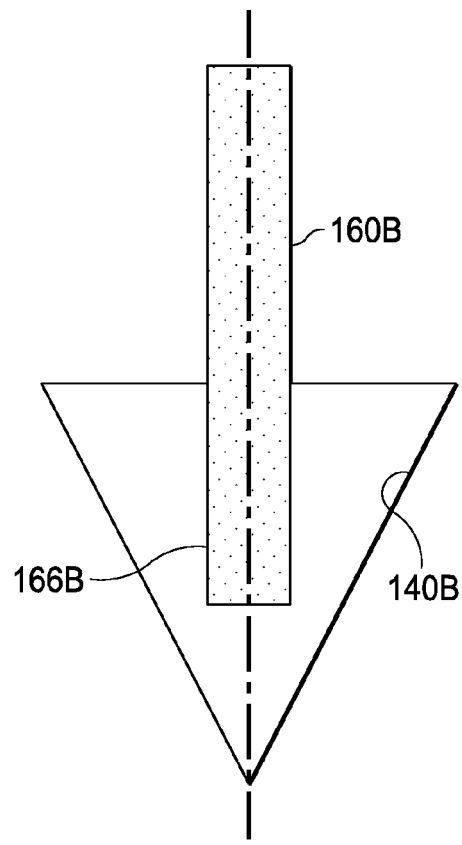
FIG. 15 is a schematic cross sectional view of another alternative configuration of a stud member and annular centering surface.

One alternative arrangement of a stud and annular centering surface is illustrated in FIG. 14. In this embodiment the stud 160 comprises a cylindrical member 160A having a distal end that terminates in a cylindrical edge 166A. The annular centering surface 140A opposed to the stud terminal end 166A is an arcuate surface 140A of constant radius. Another embodiment is illustrated in FIG. 15 in which the stud member is again a substantially cylindrical stud member 160B terminating in a cylindrical bottom edge 166B. The annular centering surface comprises an inverted cone shaped surface 140B.

Figure 16:
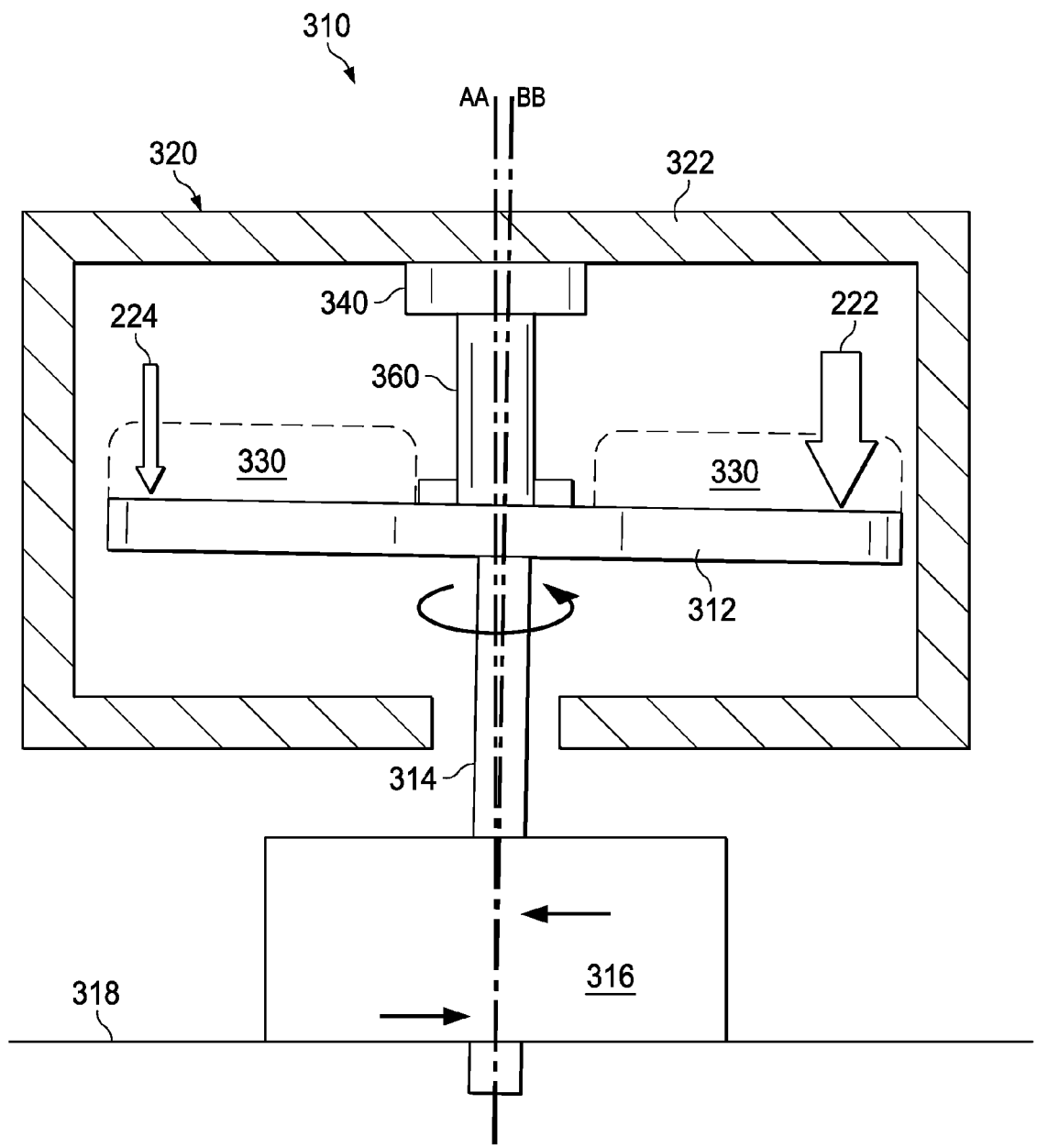
FIG. 16 is a schematic cross sectional view of a self-centering turntable apparatus having an annular centering surface mounted on a turntable and having a stud member mounted of a frame member above the annular centering surface.

FIG. 16 illustrates an embodiment of a turntable apparatus 310 similar to that shown in FIG. 2, except that the stud member 360 is fixedly mounted on the turntable 312, extending upwardly therefrom. The stud member 360 is in coaxial alignment with the turntable 312/shaft 314 actual rotation axis BB. Also the annular centering surface 340 is provided on a plate which is fixedly mounted on an upper frame member 322 with the central longitudinal axis thereof in alignment with the predetermined desired rotation axis AA of the turntable assembly 310. In the assembly illustrated in FIG. 16, the annular centering surface 340 is always aligned with the ideal rotation axis AA and the central longitudinal axis of the upwardly extending stud member 360 is always aligned with the actual rotation axis BB of the turntable plate 312 and rotatable shaft 314. The upwardly extending stud member 360 and the annular centering surface 340 co-act to produce relative centering displacement between the stud member 360 and annular centering surface 340 in the same manner as stud member 160 and annular centering surface 140 described above with reference to FIGS. 12 and 13. However, in this embodiment, the stud member 360 is the member that actually moves.

Figure 17:
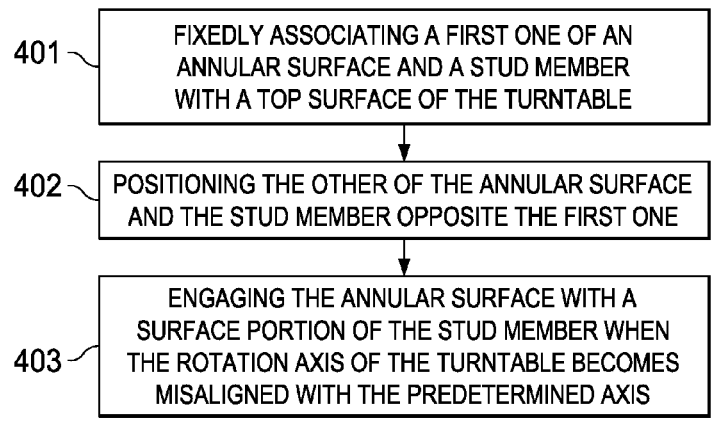
FIG. 17 is a flow diagram of a method for maintaining a rotational axis of a turntable in alignment with a desired rotation axis.
Figure 6:
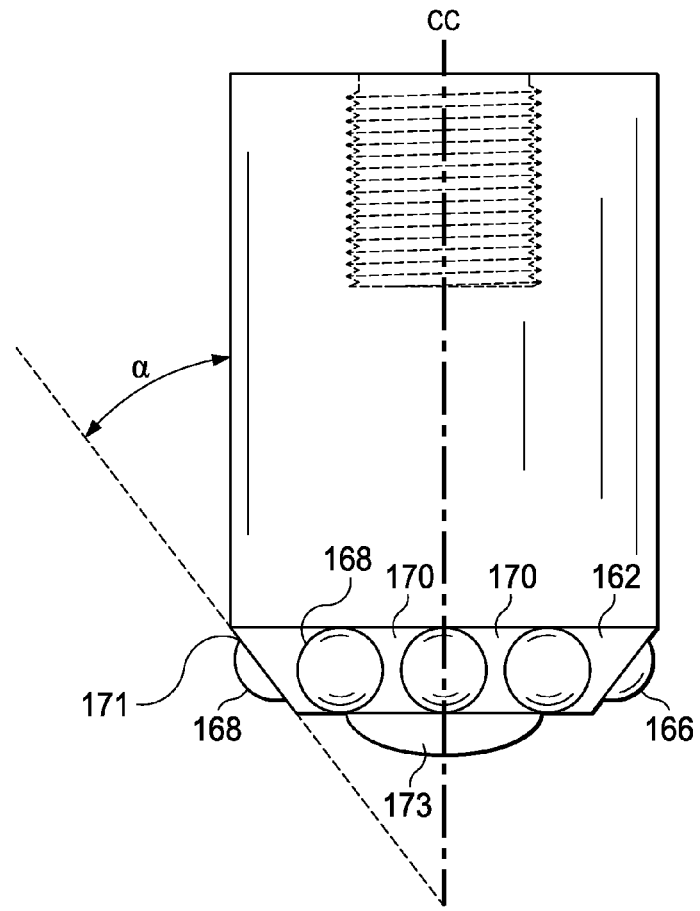
FIG. 6 is a detail side elevation view of the distal end of an example embodiment of a stud member.
Figure 7:
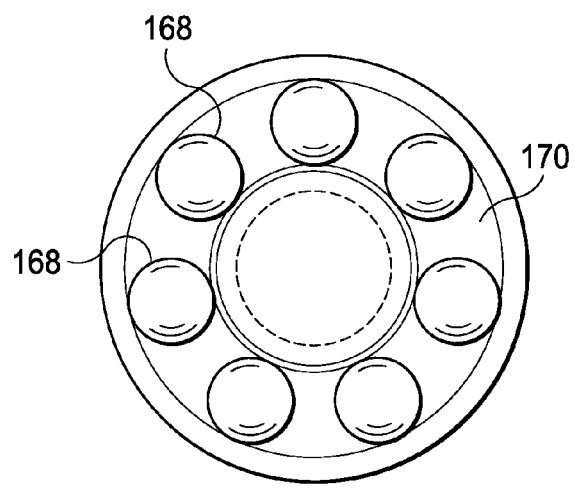
FIG. 7 is a bottom plan view of the distal end of the stud member of FIG. 6.
Figure 8:
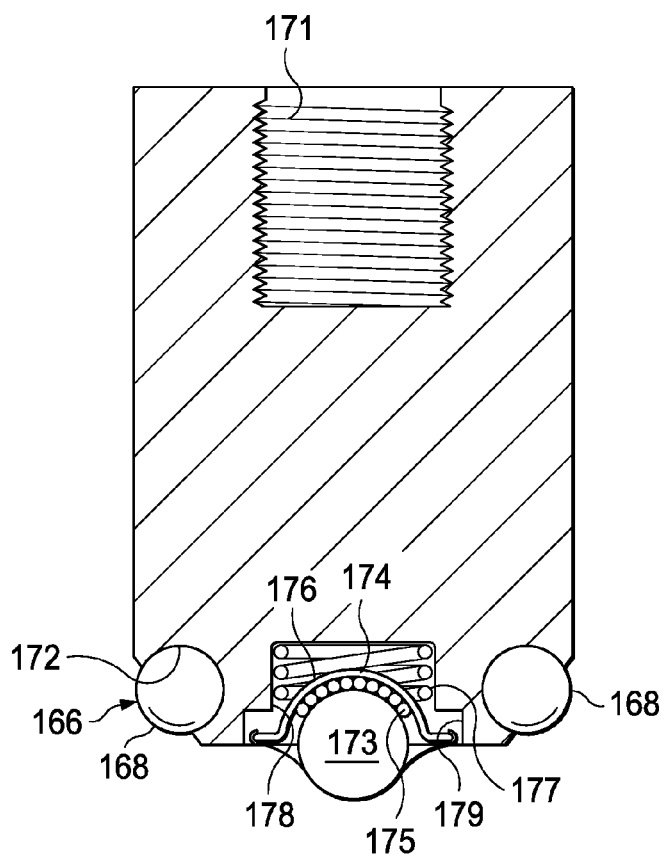
FIG. 8 is a cross sectional elevation view of the distal end of the stud member of FIGS. 6 and 7.

FIG. 17 is a flow chart of a method for maintaining the rotation axis of a turntable in alignment with a predetermined desired rotation axis of the turntable. The method includes, as shown at 401, fixedly associating a first one of an annular surface and a stud member with a top surface of the turntable. The method also includes, as shown at 402, positioning the other of the annular surface and the stud member opposite the first one. The method further includes engaging the annular surface with a surface portion of the stud member when the rotation axis of the turntable becomes misaligned with the predetermined axis, as shown at 403.

While certain illustrative embodiments of a turntable apparatus have been described in detail herein, it is to be understood that the inventive concepts disclosed may be otherwise variously embodied and employed. The appended claims are intended to be construed to include such variations, except insofar as limited by the prior art.

What is claimed is:

1. An apparatus for rotating a load about a predetermined rotation axis comprising:
a rotatable shaft having a central longitudinal axis;
a turntable fixedly mounted on said rotatable shaft and adapted to support said load;
an annular centering surface; and
a stud member positioned opposite said annular centering surface, said stud member comprising a distal end portion further comprising:
at least one surface adapted to make low frictional contact with said annular centering surface, said at least one surface of said distal end portion comprises at least one rotatable bearing surface;
a peripheral portion comprising an annular surface that is inclined downwardly and inwardly relative said predetermined rotation axis, wherein said at least one surface of said distal end portion further comprises a plurality of ball bearing surfaces arranged about said peripheral portion of said distal end;
one of said annular centering surface and said stud member being affixed to said turntable, said annular centering surface and said stud member being adapted to co-act to maintain said central longitudinal axis of said rotatable shaft in alignment with said predetermined rotation axis.

2. The apparatus of claim 1 wherein said annular centering surface is affixed to said turntable.

3. The apparatus of claim 2 wherein said annular centering surface is a portion of a separate member attached to said turntable.

4. The apparatus of claim 2 further comprising a selectively displaceable and fixedly positionable plate member, said stud member being fixedly mounted on said displaceable plate member and being positionable opposite said annular centering surface by displacement of said displaceable plate member.

5. The apparatus of claim 1 wherein said stud member is affixed to said turntable.

6. The apparatus of claim 1 wherein said annular centering surface is an arcuate surface.

7. The apparatus of claim 1 wherein said annular centering surface is symmetrical about a central longitudinal axis that is coaxial with said central longitudinal axis of said rotatable shaft.

8. The apparatus of claim 1 wherein said annular centering surface has a substantially constant radius.

9. The apparatus of claim 1 wherein annular surface is inclined downwardly and inwardly relative said predetermined rotation axis at an angle of about 45°.

10. The apparatus of claim 1 wherein said plurality of rotatable bearings surfaces comprise a central bearing positioned on said central longitudinal axis of said stud member at said distal end thereof.

11. The apparatus of claim 10 wherein said central bearing is spring biased in a direction toward said annular centering surface.

12. An apparatus for rotating a load about a predetermined rotation axis of the
apparatus comprising:
a base;
a shaft having a central longitudinal axis, said shaft being rotatably supported relative said base;
a turntable having a top portion adapted to support said load thereon, said top portion having an annular centering surface thereon, said turntable being mounted on said rotatable shaft and rotatable therewith; and
a stud member having a distal end surface and having a predetermined operating position in which said distal end surface is located opposite said annular centering surface and in which said stud member is maintained in stationary rotational and translational relationship with said base, said stud member distal end surface applying a corrective centering force to said annular centering surface when said central longitudinal axis of said shaft becomes misaligned with said predetermined rotation axis of said apparatus, whereby said central longitudinal axis of said shaft is continuously correctively realigned with said predetermined rotation axis.

\* \* \* \* \*